(12) United States Patent
Sawabe et al.

(10) Patent No.: US 8,558,224 B2
(45) Date of Patent: Oct. 15, 2013

(54) ORGANIC LIGHT-EMITTING DIODE, DISPLAY AND ILLUMINATING DEVICE

(75) Inventors: Tomoaki Sawabe, Tokyo (JP); Isao Takasu, Tokyo (JP); Tomio Ono, Yokohama (JP); Shintaro Enomoto, Yokohama (JP); Takashi Kaneko, Imbari (JP); Shinjiro Aono, Imbari (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 13/231,030

(22) Filed: Sep. 13, 2011

(65) Prior Publication Data
US 2012/0241725 A1    Sep. 27, 2012

(30) Foreign Application Priority Data
Mar. 23, 2011    (JP) ................. 2011-065040

(51) Int. Cl.
H01L 29/08    (2006.01)
(52) U.S. Cl.
USPC .................. 257/40; 438/99
(58) Field of Classification Search
USPC ................................. 257/40
See application file for complete search history.

(56) References Cited

U.S. PATENT DOCUMENTS

| | | | |
|---|---|---|---|
| 8,207,526 B2 * | 6/2012 | Nishimura et al. | 257/40 |
| 2006/0232194 A1 * | 10/2006 | Tung et al. | 313/504 |
| 2010/0140645 A1 * | 6/2010 | Shibata | 257/98 |
| 2010/0230688 A1 | 9/2010 | Mitsuya et al. | |

FOREIGN PATENT DOCUMENTS

| | | |
|---|---|---|
| EP | 1667494 A1 | 6/2006 |
| EP | 1670082 A2 | 6/2006 |
| EP | 1670082 A3 | 1/2009 |
| KR | 10-2006-0071399 | 6/2006 |
| WO | WO2008/123178 | * 10/2008 |

OTHER PUBLICATIONS

You-Hyun Kim, Woo Young Kim, and C.-B. Moon, Energy transfer between host and dopant molecules in blue organic light-emitting devices, J. Appl. Phys. 110, 034501 (2011).*
Woo Sik Jeon, Tae Jin Park, Sun Young Kim, Ramchandra Pode, Jin Jang, Jang Hyuk Kwon, Ideal host and guest system in phosphorescent OLEDs, Organic Electronics, vol. 10, Issue 2, Apr. 2009, pp. 240-246.*
Schwartz, et al., "Balanced ambipolar charge carrier mobility in mixed layers for application in hybrid white organic light-emitting diodes", Applied Physics Letters 93, 2008, American Institute of Physics, 073304-1.

(Continued)

*Primary Examiner* — Jenny L Wagner
*Assistant Examiner* — Mark Tornow
(74) *Attorney, Agent, or Firm* — Turocy & Watson, LLP (57) ABSTRACT

According to one embodiment, there is provided an organic light-emitting diode including an anode and a cathode which are arranged apart from each other, a red and green emissive layer on the anode side and a blue emissive layer on the cathode side, which are arranged to be separated from each other between the anode and the cathode, and a spacer layer which is inserted between the red and green emissive layer and the blue emissive layer, and consists of a hole transport material which prevents energy transfer from the blue emissive layer to the red and green emissive layer. The red and green emissive layer contains a host material having hole transportability, a red phosphorescent emitting dopant, and a green phosphorescent emitting dopant, and the blue emissive layer contains a host material having electron transportability and a blue fluorescent emitting dopant.

8 Claims, 4 Drawing Sheets

(56) References Cited

OTHER PUBLICATIONS

Korean Office Action for Korean Application No. 10-2011-90768 mailed on Dec. 7, 2012.

Kyoung Soo Yook, et al. "High efficiency, color, stability, and stable efficiency roll off in three color hybrid white organic light emitting diodes." Applied Physics Letters 93, 073302 (2008) 3 pages.
European Search Report dated Mar. 26, 2013 for European Patent Application No. 11181032, 7 pages.

* cited by examiner

ORGANIC LIGHT-EMITTING DIODE, DISPLAY AND ILLUMINATING DEVICE

CROSS-REFERENCE TO RELATED APPLICATIONS

This application is based upon and claims the benefit of priority from prior Japanese Patent Application No. 2011-065040, filed Mar. 23, 2011, the entire contents of which are incorporated herein by reference.

FIELD

Embodiments described herein relate generally to an organic light-emitting diode, and a display and a lighting device using the same.

BACKGROUND

In recent years, an organic light-emitting diode has been attracting attention for the use purpose of, for example, a flat surface light source. The organic light-emitting diode has a configuration in which an emissive layer made up of an organic material is sandwiched between a pair of electrodes, that is, a cathode and anode. When a voltage is applied to the diode, electrons and holes are respectively injected from the cathode and anode into the emissive layer, and recombine in the emissive layer to generate excitons. When the excitons are radiatively deactivated, light emission is obtained.

An emitting dopant used in the organic light-emitting diode includes a fluorescent emitting dopant and phosphorescent emitting dopant. As for the fluorescent emitting dopant, a highly reliable dopant having a long life is obtained for all of blue, green, and red emitting dopants. However, since the fluorescent emitting dopant converts only singlet excitons into light emission, the maximum value of the internal quantum efficiency is limited to 25%. On the other hand, the phosphorescent emitting dopant which can convert both singlet and triplet excitons into light emission is expected to yield an internal quantum efficiency of nearly 100%. However, although a highly reliable dopant is obtained for green and red phosphorescent emitting dopants, development of a highly reliable blue phosphorescent emitting dopant has been slow.

In a white organic light-emitting diode which is expected to be applied to illuminations and backlights of displays, white light is obtained from those of three colors, that is, red, green, and blue. In such an organic light-emitting diode, when phosphorescent emitting dopants are used for all of red, green, and blue emitting dopants, a high luminous efficiency is expected, as described above. However, since the blue phosphorescent emitting dopant having a short life has to be used, a life time of the diode shortens, resulting in low reliability of the diode.

Hence, an attempt has been made to prepare a white organic light-emitting diode having a long life and high reliability by using a blue fluorescent emitting dopant having a longer life than the blue phosphorescent emitting dopant as a blue emissive layer, and using phosphorescent emitting dopants as a red and green emissive layer. In order to obtain white light emission by the organic light-emitting diode with such configuration, carrier recombination must take place in both the red and green emissive layer and the blue emissive layer, and the generated excitons have to be confined in the emissive layer. Various efforts to obtain white light emission have been made so far by devising the element configurations, materials to be used, and the like. However, excellent white light emission cannot be obtained. Even when white light emission is obtained, if the luminous efficiency is low, it is difficult to put the diode into practical use.

DETAILED DESCRIPTION

In general, according to one embodiment, there is provided an organic light-emitting diode including an anode and a cathode which are arranged apart from each other, a red and green emissive layer on the anode side and a blue emissive layer on the cathode side, which are arranged to be separated from each other between the anode and the cathode, and a spacer layer which is inserted between the red and green emissive layer and the blue emissive layer, and consists of a hole transport material which prevents energy transfer from the blue emissive layer to the red and green emissive layer. The red and green emissive layer contains a host material having hole transportability, a red phosphorescent emitting dopant, and a green phosphorescent emitting dopant, and the blue emissive layer contains a host material having electron transportability and a blue fluorescent emitting dopant. A HOMO of the red phosphorescent emitting dopant and the green phosphorescent emitting dopant and a HOMO of the hole transport material in the spacer layer have nearly equal energy levels. A HOMO-LUMO energy gap of the hole transport material in the spacer layer is larger than a HOMO-LUMO energy gap of the blue fluorescent emitting dopant. The thickness of the spacer layer is 3 to 5 nm.

Embodiments of the present invention are explained below in reference to the drawings.

Figure 1:
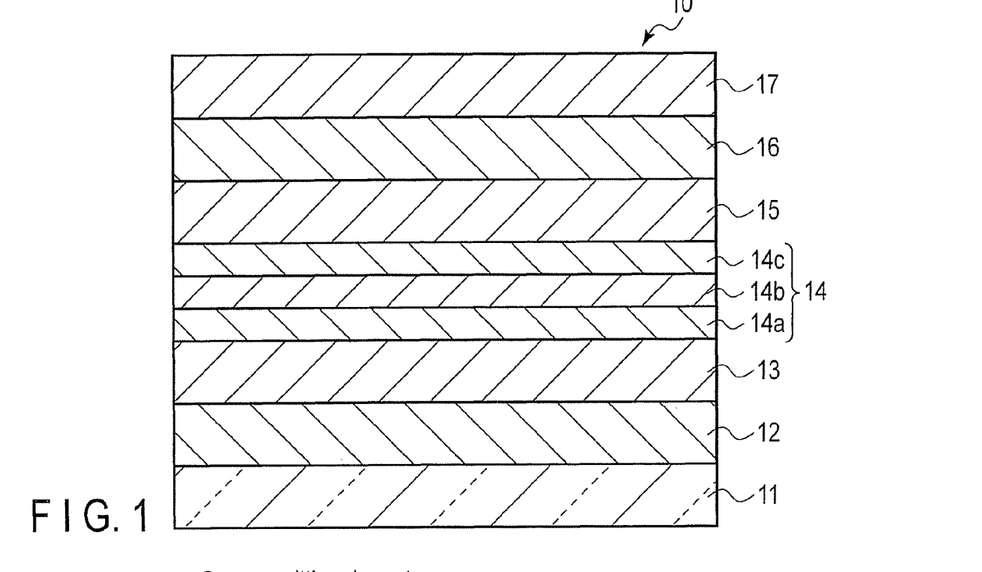
FIG. 1 is a cross-sectional view of an organic light-emitting diode of an embodiment.

FIG. 1 is a cross-sectional view of the organic light-emitting diode of an embodiment.

In the organic light-emitting diode 10, an anode 12, hole transport layer 13, emissive layer 14, electron transport layer 15, electron injection layer 16 and cathode 17 are formed in sequence on a substrate 11. The hole transport layer 13, electron transport layer 15 and electron injection layer 16 are formed if necessary. The emissive layer 14 includes a red and green emissive layer 14a arranged on the anode side, a blue emissive layer 14c arranged on the cathode side, and a spacer layer 14b inserted between the red and green emissive layer 14a and the blue emissive layer 14c.

<First Embodiment>

Figure 2:
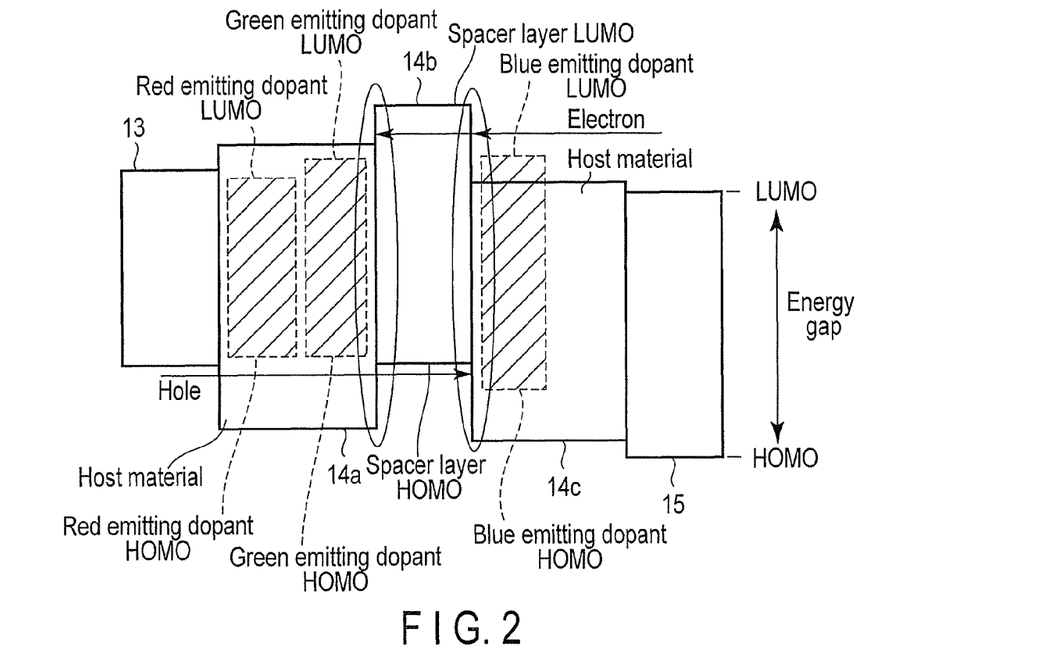
FIG. 2 is an energy diagram of an organic light-emitting diode according to a first embodiment.

The first embodiment of the present invention will be described below with reference to FIG. 2. FIG. 2 is an energy diagram of an organic light-emitting diode according to the first embodiment.

The red and green emissive layer 14a has a configuration obtained by doping red and green phosphorescent emitting dopants in a host material having hole transportability. The blue emissive layer 14c has a configuration obtained by doping a blue fluorescent emitting dopant in a host material having electron transportability.

The spacer layer 14b has a role of preventing energy transfer from the blue emissive layer 14c to the red and green emissive layer 14a, and consists of a hole transport material. The hole transport material contained in the spacer layer 14b is a single material, and the spacer layer 14b does not contain any electron transport material.

When a voltage is applied to the organic light-emitting diode, holes are injected from the anode, and are transferred to the emissive layer 14 via the hole transport layer 13. The holes injected into the red and green emissive layer 14a transfer to the interface between the spacer layer 14b and the blue emissive layer 14c via the host material having hole transportability contained in the red and green emissive layer 14a and the hole transport material which configures the spacer layer 14b. In this embodiment, the highest occupied molecular orbital (HOMO) of the red emitting dopant and that of the hole transport material which configures the spacer layer 14b have nearly equal energy levels. Also, the HOMO of the green emitting dopant and that of the hole transport material which configures the spacer layer 14b have nearly equal energy levels. Hence, holes smoothly transfer from the red and green emissive layer 14a to the spacer layer 14b. In order to efficiently inject carriers into red and green emitting dopants, an energy difference between the HOMO of the red and green emitting dopants and that of the hole transport material in the spacer layer 14b preferably falls within the range of ±0.3 eV. In order to transfer holes more smoothly, the HOMO of the hole transport material contained in the hole transport layer 13 is preferably close to those of the red and green emitting dopants and the hole transport material in the spacer layer 14b.

On the other hand, electrons are injected from the cathode 17. The injected electrons transfer to the emissive layer via the electron transport layer 15. Electrons injected into the blue emissive layer 14c transfer to the interface between the blue emissive layer 14c and the spacer layer 14b via the host material having the electron transportability contained in the blue emissive layer 14c. However, since the spacer layer 14b consists of the hole transport material, the electrons are accumulated on this interface. In order to obtain all of red, green, and blue light emissions, excitons have to be generated on the interface between the red and green emissive layer 14a and the spacer layer 14b and that between the blue emissive layer 14c and the spacer layer 14b. Therefore, the electrons accumulated on the interface between the blue emissive layer 14c and the spacer layer 14b have to be transferred to the interface between the spacer layer 14b and the red and green emissive layer 14a via the spacer layer 14b.

In this embodiment, the film thickness of the spacer layer 14b is 3 to 5 nm. By forming the spacer layer 14b to have such thickness, electrons accumulated on the interface between the blue emissive layer 14c and the spacer layer 14b can be transferred to that between the spacer layer 14b and the red and green emissive layer 14a by a tunnel effect. As a result, excitons can be respectively generated on the interface between the red and green emissive layer 14a and the spacer layer 14b, and that between the blue emissive layer 14c and the spacer layer 14b, and white light emission can be obtained from light components of three colors, that is, red, green, and blue.

A HOMO-lowest unoccupied molecular orbital (LUMO) energy gap (also referred to as a HOMO-LUMO gap hereinafter) of the hole transport material in the spacer layer 14b is larger than that of the blue emitting dopant contained in the blue emissive layer 14c. In this case, the HOMO-LUMO energy gap means an energy difference between the HOMO and LUMO of a certain material. In general, as the HOMO-LUMO gap of the red and green emitting dopants is smaller than that of the blue emitting dopant, energy is unwantedly transferred from the blue emissive layer to the red and green emissive layer unless a spacer layer having a large HOMO-LUMO gap is formed. Hence, when a hole transport material having a HOMO-LUMO gap larger than that of the blue emitting dopant is used in the spacer layer, the energy of the blue emissive layer is not transferred to the red and green emissive layer since it is blocked by the spacer layer, thus sufficiently obtaining blue light emission. In order to effectively block energy transfer from the blue emissive layer 14b to the red and green emissive layer, the HOMO-LUMO gap of the hole transport material in the spacer layer is preferably 2.7 eV or more.

As the hole transport material which configures the spacer layer 14b, for example, bis[N-(1-naphthyl)-N-phenyl]benzidine (hereinafter referred to as α-NPD), 1,3-bis(N-carbazolyl)benzene (hereinafter referred to as mCP), di-[4-(N,N-ditolylamino)phenyl]cyclohexane (hereinafter referred to as TAPC), 4,4',4''-tris(9-carbazolyl)-triphenylamine (hereinafter referred to as TCTA), and the like can be used.

As the green emitting dopant, tris(2-phenylpyridine)iridium(III) (hereinafter referred to as Ir(ppy)$_3$), tris(2-(p-tolyl)pyridine)iridium(III) (hereinafter referred to as Ir(mppy)$_3$), bis(2-(9,9-dihexylfluorenyl)-1-pyridine)(acetylacetonate)iridium(III) (hereinafter referred to as Ir(hflpy)(acac)), and the like can be used. As the red emitting dopant, bis(2-methyldibenzo-[f,h]quinoxaline(acetylacetonate)iridium(III) (hereinafter referred to as Ir(MDQ)$_2$(acac)), tris(1-phenylisoquinoline)iridium(III) (hereinafter referred to as Ir(piq)$_3$), and the like can be used.

As the hole transportability host material contained in the red and green emissive layer 14a, α-NPD, mCP, di-[4-(N,N-ditolylamino)phenyl]cyclohexane (hereinafter referred to as TAPC), 4,4',4''-tris(9-carbazolyl)-triphenylamine (hereinafter referred to as TCTA), and the like can be used.

The host material contained in the red and green emissive layer can also be that having a bipolar property, and for example, 4-4'-bis(9-dicarbazolyl)-2,2'-biphenyl (hereinafter referred to as CBP) and the like can be used. Note that the bipolar property means that a material has both hole transportability and electron transportability.

As the blue emitting dopant, 1,4-di-[4-(N,N-di-phenyl)amino]styryl-benzene (hereinafter referred to as DSA-Ph), 4,4'-bis(9-ethyl-3-carbazovinylene)-1,1'-biphenyl (hereinafter referred to as BCzVBi), and the like can be used. As the electron transportability host material contained in the blue emissive layer 14c, 4,4'-bis(2,2-diphenyl-ethene-1-yl)biphenyl (hereinafter referred to as DPVBi), 9,10-bis(2-naphthyl)-2-tert-butylanthracene (hereinafter referred to as TBADN), and the like can be used.

The red and green emissive layer 14a preferably contains the green and red emitting dopants at a ratio of 20 to 40 wt % in combination. This is because holes can easily flow by containing the green and red emitting dopants at that ratio. On the other hand, when 40 wt % are exceeded, concentration quenching between the phosphorescent dopants becomes prominent, resulting in low luminous efficiency.

In order to keep good carrier balance between holes and electrons in the emissive layer, the red and green emissive layer 14a and the blue emissive layer 14c may further contain an electron transport material and/or hole transport material. By keeping an optimum carrier balance in the emissive layer, the luminous efficiency can be improved.

Non-patent literature 1 cited as the related art literature describes an example in which in an organic light-emitting diode which uses a fluorescent emitting dopant in a blue emissive layer, and uses phosphorescent emitting dopants in a red and green emissive layer, a spacer layer is formed between the blue emissive layer and the red and green emissive layer. In this diode, the spacer layer consists of a co-deposited film of electron transport materials and hole transport materials having a large energy gap. Therefore, both carriers of electrons and holes are transported via the spacer layer, thus allowing the emissive layer to confine excitons. However, the external quantum efficiency of this diode is as low as about 5%. As a cause for such low efficiency, holes are trapped by the phosphorescent emitting dopants in the red and green emissive layer, and are hardly injected into the blue emissive layer. Also, since the spacer layer is a mixed layer of electron and hole transport materials, it has a low carrier mobility, and exciplexes are readily generated in the spacer layer. Furthermore, fabrication of the co-deposited film becomes a burden.

By contrast, in this embodiment, since the aforementioned spacer layer consisted of a hole transport material having an appropriate HOMO-LUMO energy is inserted between the blue emissive layer and the red and green emissive layer, efficient carrier transportation can be realized. Also, according to the configuration of this embodiment, generation of exciplexes in the spacer layer can be prevented. As a result of these merits, white light emission can be obtained with high luminous efficiency. Since no co-deposition process is required, it can lighten the burden imposed on fabrication of the device.

Other members of the organic light-emitting diode according to the embodiment will be described in detail below with reference to FIG. 1.

The substrate 11 is a member for supporting other members. The substrate 11 is preferably one which is not distorted by heat or organic solvents. A material of the substrate 11 includes, for example, an inorganic material such as alkali-free glass and quartz glass; plastic such as polyethylene, polyethylene terephthalate (PET), polyethylene naphthalate (PEN), polyimide, polyamide, polyamide-imide, liquid crystal polymer, and cycloolefin polymer; polymer film; and metal substrate such as stainless steel (SUS) and silicon. In order to obtain light emission, a transparent substrate consisting of glass, synthesized resin, and the like is preferably used. Shape, structure, size, and the like of the substrate 11 are not particularly limited, and can be appropriately selected in accordance with application, purpose, and the like. The thickness of the substrate 11 is not particularly limited as long as it has sufficient strength for supporting other members.

The anode 12 is formed on the substrate 11. The anode 12 injects holes into the hole transport layer 13 or the emissive layer 14. A material of the anode 12 is not particularly limited as long as it exhibits conductivity. Generally, a transparent or semitransparent material having conductivity is deposited by vacuum evaporation, sputtering, ion plating, plating, and coating methods, and the like. For example, a metal oxide film and semitransparent metallic thin film exhibiting conductivity may be used as the anode 12. Specifically, a film prepared by using conductive glass consisting of indium oxide(NESA etc.), tin oxide, indium tin oxide (ITO) which is a complex thereof, zinc oxide, fluorine doped tin oxide (FTO), indium zinc oxide, gold; platinum; silver; copper; and the like are used. In particular, it is preferably a transparent electrode consisting of ITO. As an electrode material, organic conductive polymer such as polyaniline, the derivatives thereof, polythiophene, the derivatives thereof, and the like may be used. When ITO is used as the anode 12, the thickness thereof is preferably 30-300 nm. If the thickness is thinner than 30 nm, the conductivity is decreased and the resistance is increased, resulting in reducing the luminous efficiency. If it is thicker than 300 nm, ITO loses flexibility and is cracked when it is under stress. The anode 12 may be a single layer or stacked layers each composed of materials having various work functions.

The hole transport layer 13 is optionally arranged between the anode 12 and emissive layer 14. The hole transport layer 13 receives holes from the anode 12 and transports them to the emissive layer side. As a material of the hole transport layer 13, for example, polythiophene type polymer such as a conductive ink, poly(ethylenedioxythiophene):polystyrene sulfonate [hereinafter, referred to as PEDOT:PSS] can be used, but is not limited thereto. A method for forming the hole transport layer 13 is not particularly limited as long as it is a method which can form a thin film, and may be, for example, a spin coating method. After applying a solution of hole transport layer 13 in a desired film thickness, it is heated and dried with a hotplate and the like. The solution to be applied may be filtrated with a filter in advance.

The electron transport layer 15 is optionally formed on the emissive layer 14. The electron transport layer 15 receives electrons from the electron injection layer 16 and transports them to the emissive layer side. As a material of the electron transport layer 15 is, for example, tris[3-(3-pyridyl)-mesityl]borane [hereinafter, referred to as 3TPYMB], tris(8-hydroxyquinolinato)aluminum [hereinafter, referred to as $Alq_3$], and basophenanthroline (BPhen), but is not limited thereto. The electron transport layer 15 is formed by vacuum evaporation method, a coating method or the like.

The electron injection layer 16 is optionally formed on the electron transport layer 15. The electron injection layer 16 receives electrons from the cathode 17 and transports them to the electron transport layer 15 or emissive layer 14. A material of the electron injection layer 16 is, for example, CsF, LIF, LiQ, Ba, BaO, Ca and the like, but is not limited thereto. The electron injection layer 16 is formed by vacuum evaporation method, a coating method or the like.

The cathode 17 is formed on the emissive layer 14 (or the electron transport layer 15 or the electron injection layer 16). The cathode 17 injects electrons into the emissive layer 14 (or the electron transport layer 15 or the electron injection layer 16). Generally, a transparent or semitransparent material having conductivity is deposited by vacuum evaporation, sputtering, ion plating, plating, coating methods, and the like. Materials for the cathode include a metal oxide film and semitransparent metallic thin film exhibiting conductivity. When the anode 12 is formed with use of a material having high work function, a material having low work function is preferably used as the cathode 17. A material having low work function includes, for example, alkali metal and alkali earth metal. Specifically, it is Li, In, Al, Ca, Mg, Na, K, Yb, Cs, Ag and the like.

The cathode 17 may be a single layer or stacked layers each composed of materials having various work functions. Further, it may be an alloy of two or more metals. Examples of the alloy include a lithium-aluminum alloy, lithium-magnesium alloy, lithium-indium alloy, magnesium-silver alloy, magnesium-indium alloy, magnesium-aluminum alloy, indium-silver alloy, and calcium-aluminum alloy.

The thickness of the cathode 17 is preferably 10-150 nm. When the thickness is thinner than the aforementioned range, the resistance is excessively high. When the film thickness is thicker, long period of time is required for deposition of the cathode 17, resulting in deterioration of the performance due to damage to the adjacent layers.

Explained above is an organic light-emitting diode in which an anode is formed on a substrate and a cathode is arranged on the opposite side to the substrate, but the substrate may be arranged on the cathode side. Also, even if the positions of the blue emissive layer and the red and green emissive layer are replaced, the same effects can be obtained.

<Second Embodiment>

Figure 3:
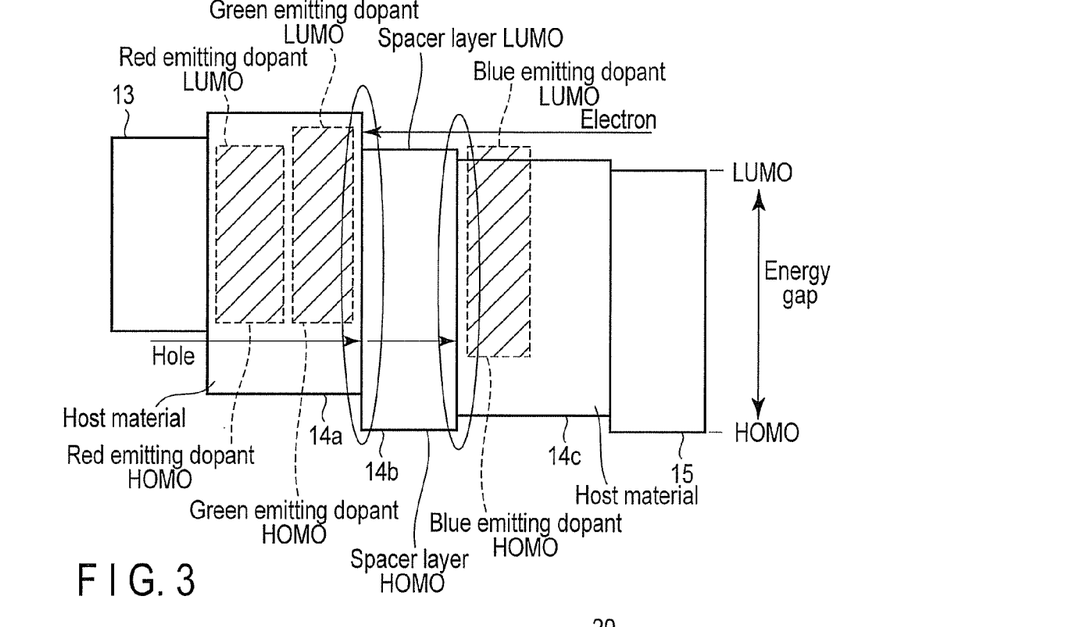
FIG. 3 is an energy diagram of an organic light-emitting diode according to a second embodiment.

The second embodiment of the present invention will be described below with reference to FIG. 3. FIG. 3 is an energy diagram of an organic light-emitting diode according to the second embodiment.

A red and green emissive layer 14a has a configuration obtained by doping red and green phosphorescent emitting dopants in a host material having hole transportability. A blue emissive layer 14c has a configuration obtained by doping a blue fluorescent emitting dopant in a host material having electron transportability.

A spacer layer 14b has a role of preventing energy transfer from the blue emissive layer 14c to the red and green emissive layer 14a, and consists of an electron transport material. The electron transport material which configures the spacer layer 14b is a single material, and the spacer layer 14b does not contain any hole transport material.

When a voltage is applied to the organic light-emitting diode, electrons are injected from a cathode, and transfer to an emissive layer via an electron transport layer 15. The electrons injected into the blue emissive layer 14c are transferred to the interface between the spacer layer 14b and the red and green emissive layer 14a via the host material having electron transportability contained in the blue emissive layer 14c and the electron transport material that configures the spacer layer 14b. In this embodiment, the LUMO of the host material having electron transportability contained in the blue emissive layer 14c and that of the electron transport material in the spacer layer 14b have nearly equal energy levels. Therefore, electrons smoothly transfer from the blue emissive layer to the spacer layer. An energy difference between the LUMO of the host material having electron transportability contained in the blue emissive layer 14c and that of the electron transport material that configures the spacer layer 14b preferably falls within the range of ±0.3 eV. In order to allow smoother transfer of electrons, the LUMO of the electron transport material in the electron transport layer 15 is also preferably close to those of the electron transport material contained in the blue emissive layer 14c and the electron transport material that configures the spacer layer 14b.

On the other hand, holes are injected from an anode. The injected holes transfer to the emissive layer via a hole transport layer 13. The holes injected into the red and blue emissive layer 14a are transferred to the interface between the red and green emissive layer 14a and the spacer layer 14b via the host material having hole transportability contained in the red and green emissive layer 14a. However, the holes are accumulated on this interface since the spacer layer 14b consists of the electron transport material. However, in order to obtain all of red, green, and blue light emissions, excitons have to be generated on the interface between the red and green emissive layer 14a and the spacer layer 14b and that between the blue emissive layer 14c and the spacer layer 14b. Therefore, the holes accumulated on the interface between the red and green emissive layer 14a and the spacer layer 14b have to be transferred to that between the spacer layer 14b and the blue emissive layer 14c via the spacer layer 14b.

In this embodiment, the film thickness of the spacer layer 14b is 3 to 5 nm. By forming a spacer layer 14b to have such thickness, the holes accumulated on the red and green emissive layer 14a and the spacer layer 14b can be transferred to that between the spacer layer 14b and the blue emissive layer 14c by a tunnel effect. As a result, excitons can be generated on the interface between the red and green emissive layer 14a and the spacer layer 14b and that between the blue emissive layer 14c and the spacer layer 14b, thus obtaining white light emission from light components of the three colors, that is, red, green, and blue.

A HOMO-LUMO gap of the electron transport material which configures the spacer layer 14b is larger than that of the blue emitting dopant contained in the blue emissive layer 14c. The reason for this is as has been described in the first embodiment. In order to effectively block energy transfer from the blue emissive layer to the red and green emissive layer, the HOMO-LUMO gap of the electron transport material which configures the spacer layer 14b is preferably 2.7 eV or more.

As the electron transport material which configures the spacer layer 14b, for example, 1,3-bis(2-(4-tert-butylphenyl)-1,3,4-oxydiazole-5-yl)benzene (hereinafter referred to as OXD-7), 4,7-diphenyl-1,10-phenanthroline (hereinafter referred to as Bphen), bis(2-methyl-8-quinolinate)-4-(phenylphenolate) aluminum (hereinafter referred to as BAlq), and the like can be used.

As the green emitting dopant, tris(2-phenylpyridine)iridium(III) (hereinafter referred to as Ir(ppy)$_3$), tris(2-(p-tolyl)pyridine)iridium(III) (hereinafter referred to as Ir(mppy)$_3$), bis(2-(9,9-dihexylfluorenyl)-1-pyridine)(acetylacetonate)iridium(III) (hereinafter referred to as Ir(hflpy)(acac)), and the like can be used. As the red emitting dopant, bis(2-methylbenzo-[f,h]quinoxaline)(acetylacetonate)iridium(III) (hereinafter referred to as Ir(MDQ)$_2$(acac)), tris(1-phenylisoquinoline)iridium(III) (hereinafter referred to as Ir(piq)$_3$), and the like can be used.

As the hole transportability host material contained in the red and green emissive layer 14a, α-NPD, mCP, di-[4-(N,N-ditolylamino)phenyl]cyclohexane (hereinafter referred to as TAPC), 4,4',4"-tris(9-carbazolyl)-triphenylamine (hereinafter referred to as TCTA), and the like can be used. The host material contained in the red and green emissive layer 14a can also be that having a bipolar property, and for example, 4-4'-bis(9-dicarbazolyl)-2,2'-biphenyl (hereinafter referred to as CBP) and the like can be used.

As the blue emitting dopant, 1,4-di-[4-(N,N-di-phenyl)amino]styryl-benzene (hereinafter referred to as DSA-Ph), 4,4'-bis(9-ethyl-3-carbazovinylene)-1,1'-biphenyl (hereinafter referred to as BCzVBi), and the like can be used. As the electron transportability host material contained in the blue emissive layer 14c, 4,4'-bis(2,2-diphenyl-ethene-1-yl)biphenyl (hereinafter referred to as DPVBi), 9,10-bis(2-naphthyl)-2-tert-butylanthracene (hereinafter referred to as TBADN), and the like can be used.

The red and green emissive layer 14a preferably contains the green and red emitting dopants at a ratio of 20 to 40 wt % in combination. This is because holes can easily flow by containing the green and red emitting dopants at that ratio. On the other hand, when 40 wt % are exceeded, concentration quenching between the phosphorescent dopants becomes prominent, resulting in low luminous efficiency.

In order to keep good carrier balance between holes and electrons in the emissive layer, the red and green emissive layer and the blue emissive layer may further contain an electron transport material and/or hole transport material. By keeping an optimum carrier balance in the emissive layer, the luminous efficiency can be improved.

Other members are the same as the first embodiment. In the second embodiment as well, the same effects as in the first embodiment can be obtained.

Figure 4:
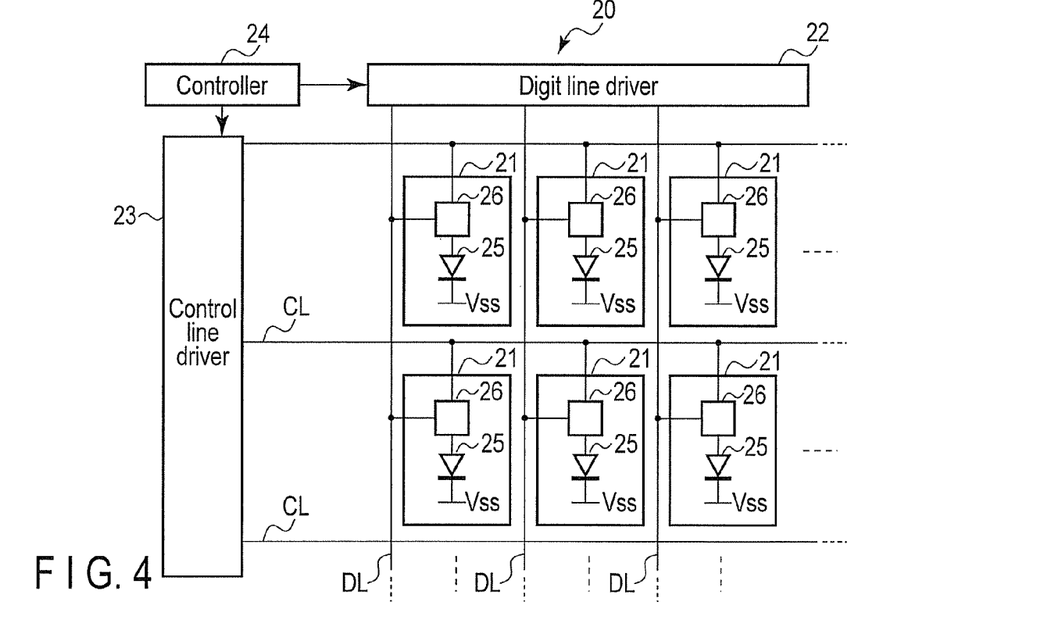
FIG. 4 is a circuit diagram showing a display of an embodiment.

FIG. 4 is a circuit diagram showing a display according to an embodiment.

A display 20 shown in FIG. 4 has a structure in which pixels 21 are arranged in circuits each provided with a lateral control line (CL) and vertical digit line (DL) which are arranged matrix-wise. The pixel 21 includes a light-emitting diode 25 and a thin-film transistor (TFT) 26 connected to the light-emitting diode 25. One terminal of the TFT 26 is connected to the control line and the other is connected to the digit line. The digit line is connected to a digit line driver 22. Further, the control line is connected to the control line driver 23. The digit line driver 22 and the control line driver 23 are controlled by a controller 24.

Figure 5:
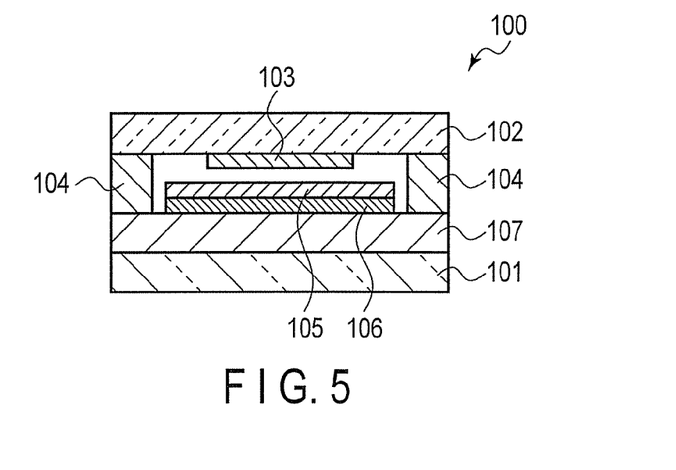
FIG. 5 is a cross-sectional view showing a lighting device of an embodiment.

FIG. 5 is a cross-sectional view showing a lighting device according to an embodiment.

A lighting device 100 has a structure in which an anode 107, an organic light-emitting diode layer 106 and a cathode 105 are formed in this order on a glass substrate 101. A seal glass 102 is disposed so as to cover the cathode 105 and adhered using a UV adhesive 104. A drying agent 103 is disposed on the cathode 105 side of the seal glass 102.

EXAMPLES

Example 1

An organic light-emitting diode was fabricated as follows using a hole transport material in a spacer layer.

A 100-nm-thick transparent electrode of indium tin oxide (ITO) was formed as an anode on a glass substrate by vapor deposition. As materials of the hole transport layer, α-NPD and TCTA films were formed in turn by vapor deposition to form a hole transport layer having a total thickness of 60 nm, that is, thicknesses of 40 and 20 nm. As materials of the red and green emissive layer, CBP was used as the bipolar host material, Ir(hflpy)(acac) was used as the green emitting dopant, and Ir(piq)3 was used as the red emitting dopant. The deposition rate of these materials was controlled to have a ratio by weight of 69.6:30:0.4, so as to co-deposit these materials on the hole transfer layer using a vacuum evaporation apparatus, thus obtaining a 25-nm-thick red and green emissive layer. Note that the HOMO of the green emitting dopant is 5.2 eV, and that of the red emitting dopant is 5.2 eV.

Subsequently, a spacer layer was formed on the red and green emissive layer. As a material of the spacer layer, α-NPD as a hole transport material was used. α-NPD is a material having a HOMO=5.4 eV and a LUMO=2.3 eV. The spacer layer was deposited on the red and green emissive layer using a vacuum evaporation apparatus.

Then, a blue emissive layer was formed on the spacer layer. In the blue emissive layer, DPVBi was used as an electron transportability host material, and DSA-Ph was used as a blue emitting dopant. The deposition rate of these materials was controlled to have a ratio by weight of 95:5, so as to co-deposit these materials on the spacer layer using a vacuum evaporation apparatus, thus forming a 7.5-nm-thick blue emissive layer. Note that the HOMO of the blue emitting dopant is 2.7 eV, and the LUMO is 5.4 eV.

After that, an electron transport layer was formed on the blue emissive layer. 3TPYMB was deposited using a vacuum evaporation apparatus so as to form a 40-nm-thick electron transport layer. Furthermore, lithium fluoride was vacuum-deposited on that layer, thus forming a 0.5-nm-thick electron transport layer. After that, aluminum was vacuum-deposited on the electron transport layer, thus forming a 150-nm-thick cathode.

Comparative Example 1

An organic light-emitting diode was fabricated in the same manner as in Example 1, except that mCP as a hole transport material was used as a material of the spacer layer.

Comparative Example 2

An organic light-emitting diode was fabricated in the same manner as in Example 1, except that CBP which exhibits a bipolar property and has hole transportability was used as a material of the spacer layer.

Test Example 1

The thickness of the spacer layer of the organic light-emitting diode fabricated in Example 1 was changed within the range of 2.0 to 6.0 nm, and their luminous characteristics were compared.

Figure 6:
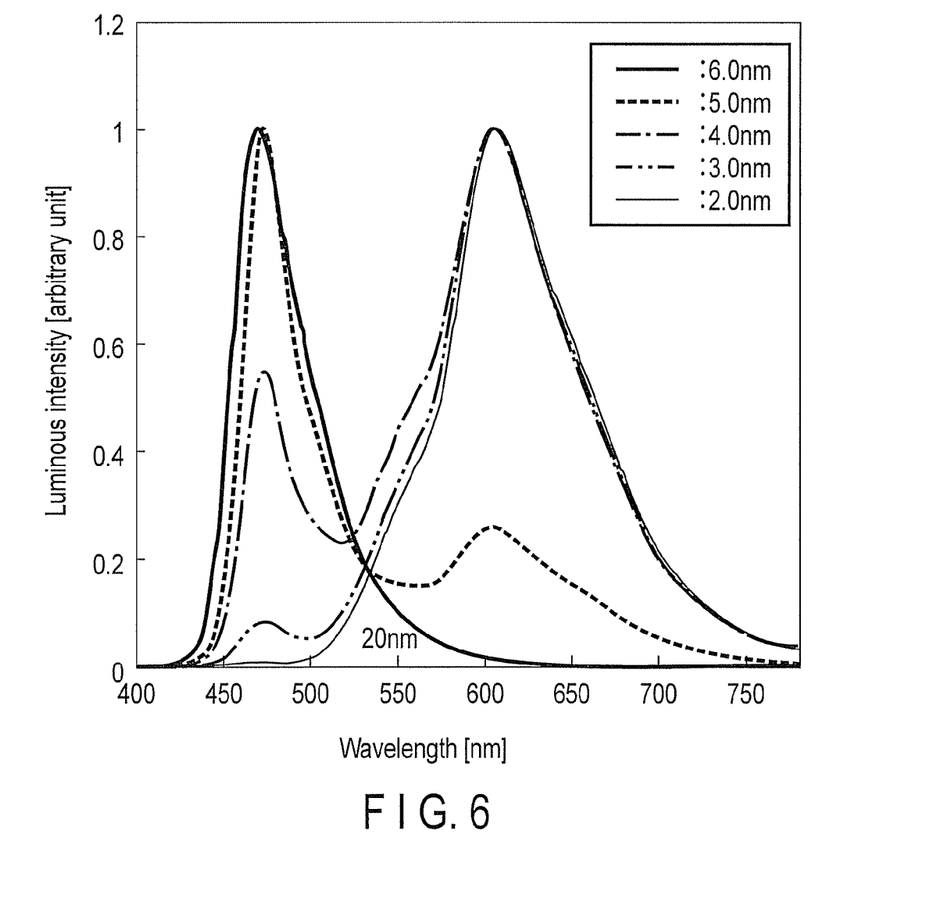
FIG. 6 is a view showing the relationship between the wavelength and luminous intensity of the diode according to Example.

Initially, luminous wavelengths and luminous intensities were examined. Measurements were conducted using an absolute quantum efficiency measurement apparatus (available from Hamamatsu Photonics K.K.) including an integrating sphere, a source meter (2400 SourceMeter available from Keithley Instruments, Inc.), and a multichannel spectroscope (C10027 available from Hamamatsu Photonics K.K.). FIG. 6 shows the measurement results.

Peaks observed near 450 to 500 nm indicate blue and green light emissions, and a peak observed near 600 nm indicates red light emission. As the thickness of the spacer layer was decreased, the peaks near 450 to 500 nm decreased. Conversely, as the thickness of the spacer layer was increased, the peak near 600 nm decreased. When the thickness of the spacer layer was 2.0 nm, the peaks near 450 to 500 nm which indicate blue and green light emissions were barely observed. When the thickness of the spacer layer was 6.0 nm, the peak near 600 nm which indicates red light emission was barely observed. Hence, it was confirmed that when the thickness of the spacer layer is 2.0 and 6.0 nm, color reproducibility worsens. By contrast, when the thickness of the spacer layer was set to fall within the range of 3.0 to 5.0 nm, peaks were observed at both near 450 to 500 nm and 600 nm. Hence, it was confirmed that by setting the thickness of the spacer layer to fall within the range of 3.0 to 5.0 nm, color reproducibility improves. Especially, in the case of 4.0 nm, peaks were clearly observed near 450 to 500 nm and 600 nm, and especially fine white light emission could be obtained.

Furthermore, the luminous efficiency, power efficiency, chromaticities, average color rendering index (Ra), and external quantum efficiency were also compared. The luminous efficiency, power efficiency, chromaticities, average color rendering index (Ra), and external quantum efficiency were measured by an absolute quantum efficiency measurement apparatus (available from Hamamatsu Photonics K.K.).

Table 1 below shows the results.

TABLE 1

| Spacer layer thickness [nm] | Luminous efficiency [cd/A] | Power efficiency [lm/W] | Chromaticity (x) | Chromaticity (y) | Ra | External quantum efficiency [%] |
|---|---|---|---|---|---|---|
| 6.0 | 9.8 | 6.2 | 0.14 | 0.20 | 48 | 5.1 |
| 5.0 | 10.1 | 6.6 | 0.27 | 0.28 | 51 | 6.6 |
| 4.0 | 23.9 | 18.3 | 0.46 | 0.39 | 77 | 11.4 |
| 3.0 | 34.6 | 27.9 | 0.54 | 0.43 | 66 | 16.8 |
| 2.0 | 32.8 | 26.5 | 0.57 | 0.43 | 61 | 16.5 |

As can be seen from Table 1, there is almost no luminous efficiency difference when the thickness of the spacer layer falls within the range of 2.0 to 3.0 nm and the range of 5.0 to 6.0 nm. However, the luminous efficiency largely changes when the thickness of the spacer layer falls within the range of 3.0 to 5.0 nm. Especially, as can be seen from Table 1, when the thickness of the spacer layer is 4 nm, Ra=77, and fine white light emission can be obtained. When the thickness of the spacer layer is 4 nm, the external quantum efficiency is 11.4%, and this value is close to 12.5%, an upper limit of the external quantum efficiency when excitons are generated in both the phosphorescent and fluorescent emissive layers.

Test Example 2

Figure 7:
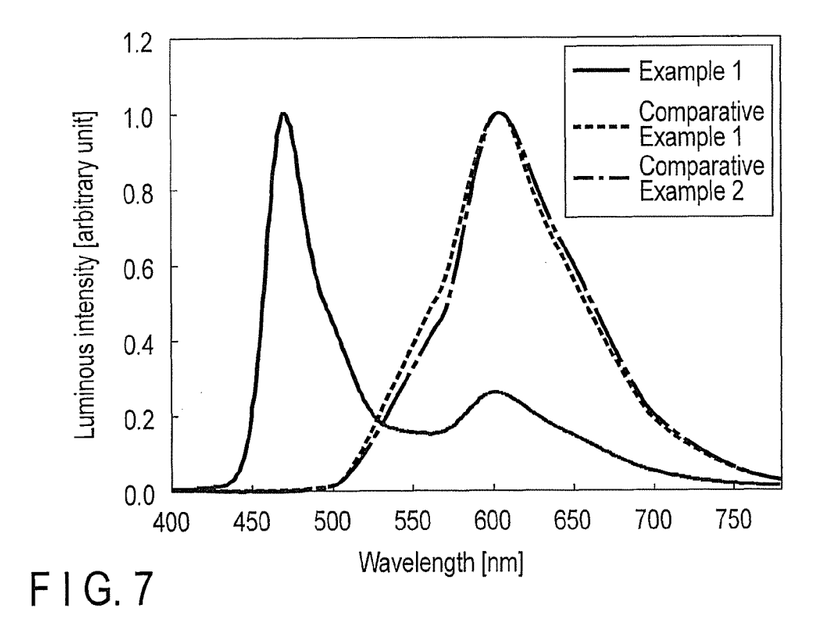
FIG. 7 is a view showing the electroluminescence spectrum of an organic light-emitting diode according to Example 1 and Comparative example 1 and 2.

Electroluminescence spectrum (EL) spectra of the organic light-emitting diodes according to Example 1 and Comparative Examples 1 and 2 were respectively measured. FIG. 7 shows the results.

When α-NPD having a HOMO=5.4 eV close to 5.2 eV as that of a phosphorescent dopant was used as a material of the spacer layer, white light emission was obtained (Example 1). By contrast, when mCP and CBP respectively having HOMOs=5.8 and 6.3 eV were used as a material of the spacer layer, only green and red light emissions were obtained (Comparative Examples 1 and 2). This is because when mCP or CBP is used as the material of the spacer layer, the HOMO of the spacer layer is too deep, and holes cannot reach the interface between the blue emissive layer and the spacer layer.

Example 2

An organic light-emitting diode was fabricated as follows using an electron transport material in a spacer layer.

A 100-nm-thick transparent electrode of indium tin oxide (ITO) was formed as an anode on a glass substrate by vapor deposition. A hole transport layer and a green and red emissive layer were fabricated using the same materials as in Example 1 in the same manner as in Example 1.

Subsequently, a spacer layer was formed on the red and green emissive layer. As a material of the spacer layer, OXD-7 as an electron transport material was used. OXD-7 is a material having a HOMO=6.4 eV and a LUMO=2.9 eV. The spacer layer was deposited on the red and green emissive layer to have a thickness of 5 nm using a vacuum evaporation apparatus.

Then, a blue emissive layer, electron transport layer, and cathode were formed on the spacer layer. The materials and fabrication methods used were the same as those in Example 1.

Test Example 3

Figure 8:
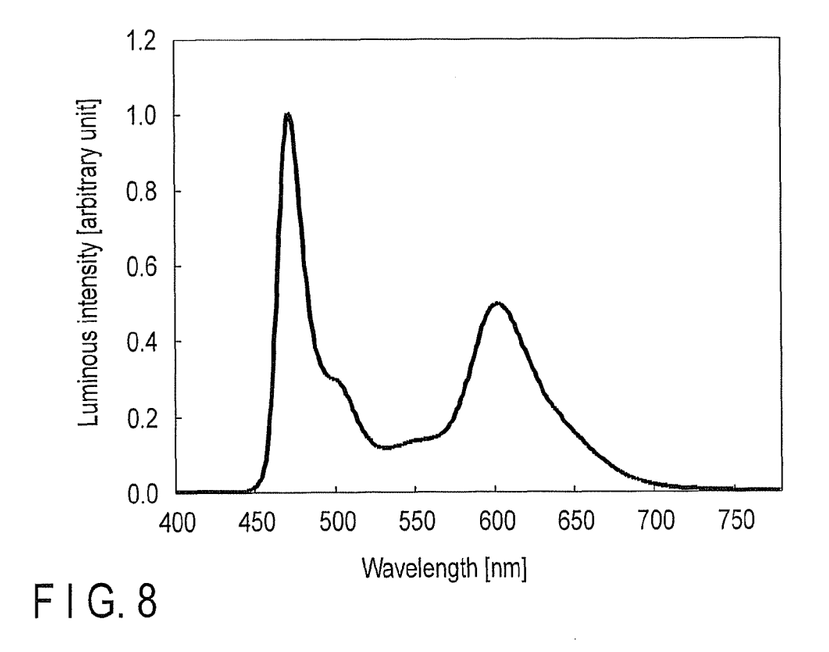
FIG. 8 is a view showing the electroluminescence spectrum of an organic light-emitting diode according to Example 2.

An electroluminescence spectrum of the organic light-emitting diode according to Example 2 was measured. FIG. 8 shows the result. A measurement was conducted using multichannel spectroscope C10027 (available from Hamamatsu Photonics K.K.). The electroluminescence spectrum exhibited light emissions of three wavelengths of red, green, and blue (RGB), and white light emission could be obtained when the electron transport material was used in the spacer layer.

According to the aforementioned embodiments or examples, in an organic light-emitting diode which uses a fluorescent emitting dopant in a blue emissive layer and phosphorescent emitting dopants in a red and green emissive layer, white light emission can be obtained at high luminous efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic light-emitting diode comprising:
    an anode and a cathode which are arranged apart from each other;
    a red and green emissive layer on the anode side and a blue emissive layer on the cathode side, which are arranged apart from each other between the anode and the cathode; and
    a spacer layer which is inserted between the red and green emissive layer and the blue emissive layer, and consists of a hole transport material which prevents energy transfer from the blue emissive layer to the red and green emissive layer,
    where the red and green emissive layer contains a host material having hole transportability, a red phosphorescent emitting dopant, and a green phosphorescent emitting dopant, and the blue emissive layer contains a host material having electron transportability and a blue fluorescent emitting dopant,
    the red and green emissive layer contains 20 to 40 wt % of the red phosphorescent emitting dopant and the green phosphorescent emitting dopant in combination,
    a HOMO of the red phosphorescent emitting dopant and the green phosphorescent emitting dopant and a HOMO of the hole transport material in the spacer layer have nearly equal energy levels,
    a HOMO-LUMO energy gap of the hole transport material in the spacer layer is larger than a HOMO-LUMO energy gap of the blue fluorescent emitting dopant, and
    a thickness of the spacer layer is 3 to 5 nm, and
    a T1 energy of the blue fluorescent emitting dopant is lower than a T1 energy of the hole transport material of the spacer layer.

2. The organic light-emitting diode according to claim 1, wherein
    an energy difference between the HOMO of the green phosphorescent emitting dopant and the red phosphorescent emitting dopant and the HOMO of the hole transport material in the spacer layer falls within a range of ±0.3 eV, and
    the HOMO-LUMO energy gap of the hole transport material in the spacer layer is 2.7 eV or more.

3. An organic light-emitting diode comprising:
    an anode and a cathode which are arranged apart from each other;

a red and green emissive layer on the anode side and a blue emissive layer on the cathode side, which are arranged apart from each other between the anode and the cathode; and a spacer layer which is inserted between the red and green emissive layer and the blue emissive layer, and consists of an electron transport material which prevent energy transfer from the blue emissive layer to the red and green emissive layer, where the red and green emissive layer contains a host material having hole transportability, a red phosphorescent emitting dopant, and a green phosphorescent emitting dopant, and the blue emissive layer contains a host material having electron transportability and a blue fluorescent emitting dopant, the red and green emissive layer contains 20 to 40 wt % of the red phosphorescent emitting dopant and the green phosphorescent emitting dopant in combination, a LUMO of the host material having electron transportability in the blue emissive layer and a LUMO of the electron transport material in the spacer layer have nearly equal energy levels, a HOMO-LUMO energy gap of the electron transport material in the spacer layer is larger than a HOMO-LUMO energy gap of the blue fluorescent emitting dopant, and a thickness of the spacer layer is 3 to 5 nm, and a T1 energy of the blue fluorescent emitting dopant is lower than a T1 enerqy of the electron transport material layer of the spacer layer.

4. The organic light-emitting diode according to claim 3, wherein an energy difference between the LUMO of the host material having the electron transportability in the blue emissive layer and the LUMO of the electron transport material in the spacer layer falls within a range of ±0.3 eV, and the HOMO-LUMO energy gap of the electron transport material in the spacer layer is 2.7 eV or more.

5. A display comprising the organic light-emitting diode according to claim 1.

6. A display comprising the organic light-emitting diode according to claim 3.

7. A lighting device comprising the organic light-emitting diode according to claim 1.

8. A lighting device comprising the organic light-emitting diode according to claim 3.

\* \* \* \* \*